(12) United States Patent
Mayock et al.

(10) Patent No.: US 7,243,040 B1
(45) Date of Patent: Jul. 10, 2007

(54) WEB-BASED CIRCUIT-TESTING SYSTEM AND METHOD

(75) Inventors: Sean M. Mayock, Raleigh, NC (US); James Troy High, Wake Forest, NC (US)

(73) Assignee: Sprint Communications Company L.P., Overland Park, KS (US)

(*) Notice: Subject to any disclaimer, the term of this patent is extended or adjusted under 35 U.S.C. 154(b) by 175 days.

(21) Appl. No.: 10/903,825

(22) Filed: Jul. 30, 2004

(51) Int. Cl.
*G06F 19/00* (2006.01)

(52) U.S. Cl. ....................... 702/122; 714/725

(58) Field of Classification Search ............. 702/57, 702/58, 59, 62, 80, 117, 118, 120, 121, 122, 702/182, 183–185, 188; 714/724, 725; 379/1.01, 379/15.01
See application file for complete search history.

(56) References Cited

U.S. PATENT DOCUMENTS

| | | | | |
|---|---|---|---|---|
| 5,978,940 | A * | 11/1999 | Newman et al. | 714/712 |
| 6,393,591 | B1 * | 5/2002 | Jenkins et al. | 714/725 |
| 6,493,425 | B1 * | 12/2002 | Abe | 379/1.01 |
| 6,519,228 | B1 * | 2/2003 | Creamer et al. | 379/15.01 |
| 6,601,200 | B1 * | 7/2003 | Delp et al. | 714/724 |
| 6,895,539 | B1 * | 5/2005 | Aragona | 714/724 |
| 2002/0026286 | A1 * | 2/2002 | Kawasaki | 702/41 |
| 2004/0019659 | A1 * | 1/2004 | Sadot et al. | 709/219 |
| 2005/0165931 | A1 * | 7/2005 | Shur et al. | 709/226 |

* cited by examiner

*Primary Examiner*—Marc S. Hoff
*Assistant Examiner*—Mohamed Charioui

(57) ABSTRACT

A method, system, and medium are provided for automated circuit testing. The system is adapted for use by human and automated clients. It enables for the testing of circuits which are associated with a particular central office switch, or other computing or telecommunications device.

30 Claims, 7 Drawing Sheets

```xml
<?xml version="1.0" encoding="UTF-8"?>
<!DOCTYPE html
    PUBLIC "-//W3C//DTD XHTML 1.0 Strict//EN"
    "http://www.w3.org/TR/xhtml1/DTD/xhtml1-strict.dtd">
- <linetest>
    <switchtype>DMS100</switchtype>
    <linetype>Ground Start</linetype>
    <testsresult>No Trouble Found</testsresult>
    - <tests>
        - <test>
            <testtype>Line</testtype>
            <result>pass</result>
            - <rawdata>
                <item>Open In</item>
                <item>TIP 999.0K 0.02UF</item>
                <item>RNG 999.0K 0.02UF</item>
                <item>TIP TO RNG 999.0K 0.03UF</item>
            </rawdata>
        </test>
        - <test>
            <testtype>Card</testtype>
            <result>pass</result>
            - <rawdata>
                <item>Card Diagnostic OK</item>
            </rawdata>
        </test>
        - <test>
            <testtype>Noise</testtype>
            <result>pass</result>
            - <rawdata>
                <item>12</item>
            </rawdata>
        </test>
    </tests>
</linetest>
```

*FIG. 5*

```
File  Edit  View  Favorites  Tools  Help
⇐ Back ▾  ⇒ ▾  ⊗  ⇧  ⇩  |  ⊕Search  ⊞Favorites  ⊕Media  ⊕ | ⊕ ▸ ⊕ ▸ ⊞

Address  http://ncwfap01:8080/switchtest/form.jsp                                    ▶ Go  Links*
```

B1 Testing Platform

Test Requested on 9195621111
Job Queued
Connection to 10.59.18.45 was a success
Login to DMS100 @ 10.59.18.45 was successful
Login to device was a success
Querying this DN
Posting this DN
Performing Line Card Diagnostic..........
Performing Line Test.......
Test complete
Attempting to analyze test results
Performing Noise Test Checking results
LnTst                Diag                    Noise              QDN              All Tests       Copy To Clipboard
9195621111
TIP          999.0K  0.000UF  1 -2
RNG          68.4K   0.730UF  0 -30
TIP TO RNG   999.0K  3.740UF
Resistance levels irregular
Cross Present, Cable Issue
Capacitance levels irregular
Open Out Present, Field Issue
Line State: IDL
Noise level: 17
Card Diagnostic OK

[Test Again]
[Go To Switch]
New Number

Done                                                                                      Local Internet

*FIG. 6*

WEB-BASED CIRCUIT-TESTING SYSTEM AND METHOD

CROSS-REFERENCE TO RELATED APPLICATIONS

Not applicable.

STATEMENT REGARDING FEDERALLY SPONSORED RESEARCH OR DEVELOPMENT

Not applicable.

TECHNICAL FIELD

This invention relates to the field of testing circuits. More particularly, the present invention provides a new and useful web-based circuit-testing system and method. This system is adapted for the purpose of testing B1 lines which are associated with computing equipment, e.g. telecommunications central office switches.

BACKGROUND OF THE INVENTION

Conventionally, circuits on central office switches are tested using a laptop or other simple computing device. This is done by making an IP connection directly into the central office switch, or other telecom device, intended for testing. FIG. 7 shows a process diagram embodying such a process. Referring the prior art figure, we see that a technician (user) 802 makes an IP connection into a central office telecom switch 804. Telecom switch 804 is normally accessed by making a telnet connection with it. The port access on a telecom switch is typically port 23 which is the default telnet port. Once the user has been logged into switch 804, the prior art process is accomplished using ProComm or some other telnet emulator that has the ability to send a telnet break.

Once the switch has been accessed, the user is able to bring up the IP address of the switch. The user then logs into the device 804 and runs the desired diagnostics tests for the particular B1 line being tested. Such diagnostics might include card diagnostics, noise tests, and other types of diagnostics which can be run over the switch 804.

This prior art arrangements has its limitations. First of all, it takes a lot of time to run the test, sometimes 5–6 seconds on average. This may not seem like a lot of time to wait, but in a process of running hundreds, even thousands of tests this amount of time can add up significantly.

Besides wasting time, another disadvantage in using the prior art arrangement shown in FIG. 7 is that it is not very user friendly. The user usually has to travel to the location of the switch to run the test.

Thus, there is a need in the art for an automated method of testing telecommunication switches which does not have the disadvantages mentioned above.

SUMMARY OF THE INVENTION

The present invention solves at least the above problems by providing a web-based system and method for testing circuits associated with telecommunication switches.

The present invention comprises computer readable media having computer usable instructions embodied thereon. These instructions enable the user to test B1 circuits on a telecommunications device. The method on the media comprises the steps of receiving at least one telephone number from a client. A test request is then transmitted to the device (e.g., a telecom switch) using the number to identify the circuit. Information regarding the functionality of the circuit is then retrieved from the device, and ultimately passed on to the client over the internet.

Each of the acts of receiving the number, transmitting the test request, retrieving the information and making the information available to the client are accomplished by running a process on a web server. More specifically, the process is a servlet.

The process also uses a remote server. This remote server communicates directly with the device in order to enable the transmitting and receiving steps. The specific process run on the remote server is a daemon process.

The system of the present invention is adapted to accommodate both human clients and automated clients. With respect to human clients, the process provides a web page. A customer then types a number into the web page. The servlet on the web server then accesses the number from the web page interacts with the remote server to determine the functionality of the circuit associated with the number on the device. Periodic feedback will then be given to the human client. This feedback will includes test status information, and is given to the client intermittently as the test process proceeds.

The system of the present invention also accommodates automated clients. For an automated client, the receiving and making steps are accomplished by interfacing with the servlet on the web server. Once the testing has been done, the test information is placed in XML format and delivered to the automated client using HTTP. The results are included in this information.

BRIEF DESCRIPTION OF THE SEVERAL VIEWS OF THE DRAWINGS

The present invention is described in detail below with reference to the attached drawing figures, which are incorporated by reference herein and wherein:

FIG. 5 shows an output file in XML which is used to report the results of the tests to the automated client.

FIG. 6 is a screen shot showing a series of test results which will be displayed on the web page for the human client.

DETAILED DESCRIPTION OF THE INVENTION

The present invention provides a web-based system and method for testing circuits on a telecommunications switch.

As one skilled in the art will appreciate, the present invention may be embodied as, among other things: a method, system, or computer-program product. Accordingly, the present invention may take the form of a hardware embodiment, a software embodiment, or an embodiment combining software and hardware. In another embodiment, the present invention takes the form of a computer-program product that includes computer-useable instructions embodied on one or more computer-readable media.

Computer-readable media include both volatile and nonvolatile media, removable and nonremovable media, and contemplates media readable by a database, a switch, and various other network devices. Network switches, routers, and related components are conventional in nature, as are means of communicating with the same. By way of example, and not limitation, computer-readable media comprise computer-storage media and communications media.

Computer-storage media, or machine-readable media, include media implemented in any method or technology for storing information. Examples of stored information include computer-useable instructions, data structures, program modules, and other data representations. Computer-storage media include, but are not limited to RAM, ROM, EEPROM, flash memory, other memory technology, CD-ROM, digital versatile discs (DVD), holographic media or other optical disc storage, magnetic cassettes, magnetic tape, magnetic disk storage, and other magnetic storage devices. These memory components can store data momentarily, temporarily, or permanently.

Communications media typically store computer-useable instructions—including data structures and program modules—in a modulated data signal. The term "modulated data signal" refers to a propagated signal that has one or more of its characteristics set or changed to encode information in the signal. An exemplary modulated data signal includes a carrier wave or other transport mechanism. Communications media include any information-delivery media. By way of example but not limitation, communications media include wired media, such as a wired network or direct-wired connection, and wireless media such as acoustic, infrared, radio, microwave, spread-spectrum, and other wireless media technologies. Combinations of the above are included within the scope of computer-readable media.

The system and method of the present invention is described in FIGS. 1–6.

Figure 1:
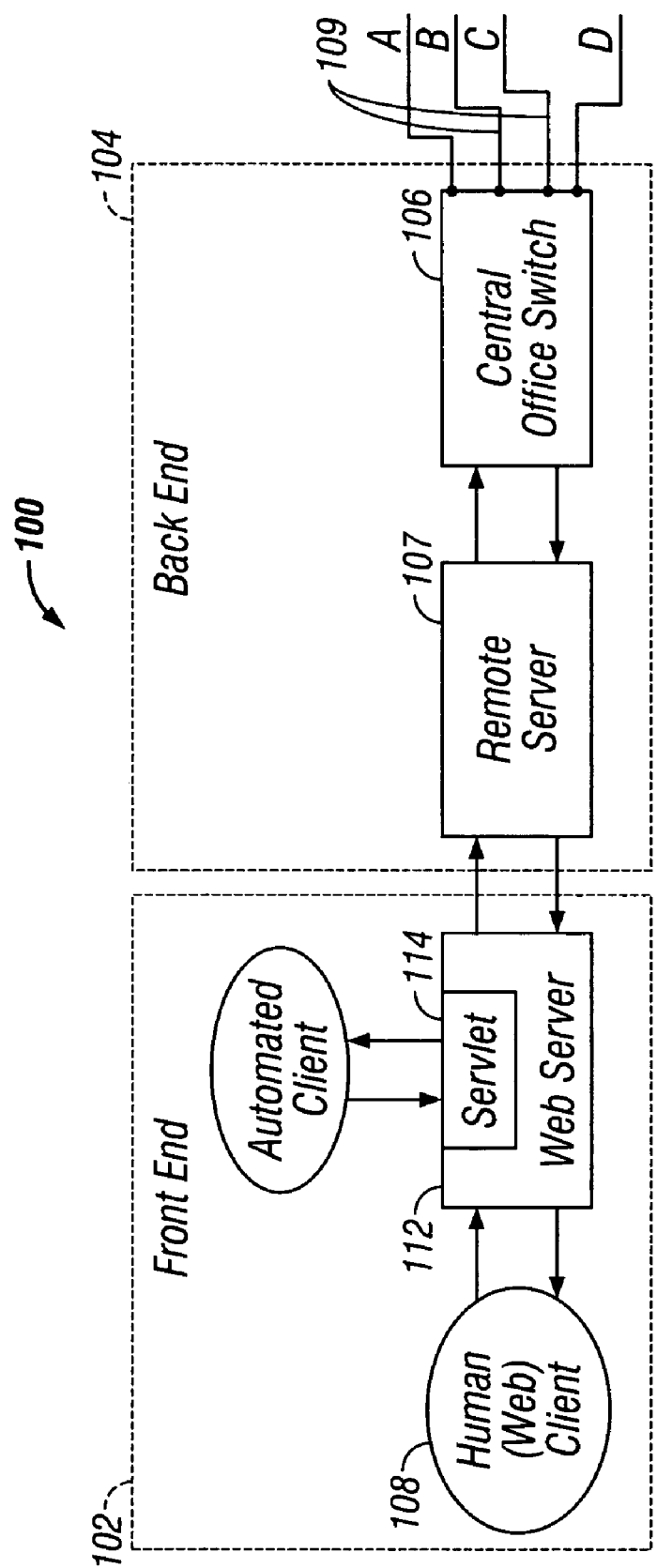
FIG. 1 is a process diagram showing the components of the present invention.

Referring first to FIG. 1, we see that the system of the present invention 100 has a front end 102 and a back end 104. At the front end 102 of the system 100, a web server 112 is used to service a human (web) client 108 and/or an automated client 110. Web server 112 has a servlet 114 running thereon which, in this embodiment, is used to service both automated client 110 and human client 108. It will be obvious to one skilled in the art, however, that separate servlets (e.g. 114 and 116) or other similar server process could be used to service each type of client. Here, however, a single servlet has been selected.

With an identification process, the servlet 114 determines if the client is human or automated. This is easily done by identifying the particular type of HTTP request received. One skilled in the art will know how these requests are transmitted across the IP connection from each client. If the communication is from a human, the request received will be an HTTP POST request. If the request is coming from an automated client, the message received will be an HTTP GET request. Thus, the POST requests are directed to human side 314 (see FIG. 3), and the GET requests are directed to the automated side of the process 316.

Web server 112 can reside on any JSP-supported platform. Thus, it is not web-server-software specific. In one embodiment, the web processes of the present invention are run on an Apache Tomcat 4.1.29 server. In another embodiment, a BEA web-logic server could be used.

Web server 112, operates for all intents and purposes, independently of the entire back end 104 of the process.

Both human client 108 and automated client 110 will communicate with web server 112 using HTTP communications. A Web server 112 communicates with a remote server 107 in the back end of the process 104. Remote server 107 then, through a telnet IP connection with a device 106 to perform the testing of a plurality of B1 lines 109 (e.g. A, B, C, D). The equipment 106 associated with the circuits (109, A, B, C, and D) to be tested in this preferred embodiment is a central office switch. More specifically, the switch is a Nortel DMS central office switch.

These types of switches are typically connected with the plurality of telephone circuits 109 (lines) to provide phone, internet, or other telecommunications services to customers. Lines A, B, C, and D are what are called POTS (or "plain old telephone service") lines. Unlike many businesses that have PBX or phone switches inside the building, a POTS line is a wire pair coming from a central office.

Though the process of the present invention has been related to copper-pair type lines, the process would work equally well for testing other types of lines such as fiber optic cables. The back end 104 of FIG. 1 has actually been somewhat simplified, and perhaps not an exactly representative of what would be found in many real-world systems which do not necessarily connect the copper pairs 109 directly into the device 106. This is because, e.g., in many suburbs, which surround larger metropolitan areas, and in many more rural areas, the telephone services often use subscriber-loop-concentrators. These are also known as slicks. The slicks would exist between a particular switch and the central office switch. A fiber optic cable will be run from the switch out to the slick, and then the slick acts more or less like a remote switch. These details have not been shown in FIG. 1 for simplicity sake. In understanding the process of the present invention, it is accurate to consider the lines as simply being copper pairs coming from a customer site to the phone switch. Whether there is a slick or not, is irrelevant from the switches perspective. Therefore, with respect to the switch/circuit arrangement, FIG. 1 is accurate regardless of whether intermediary equipment is involved.

Figure 2:
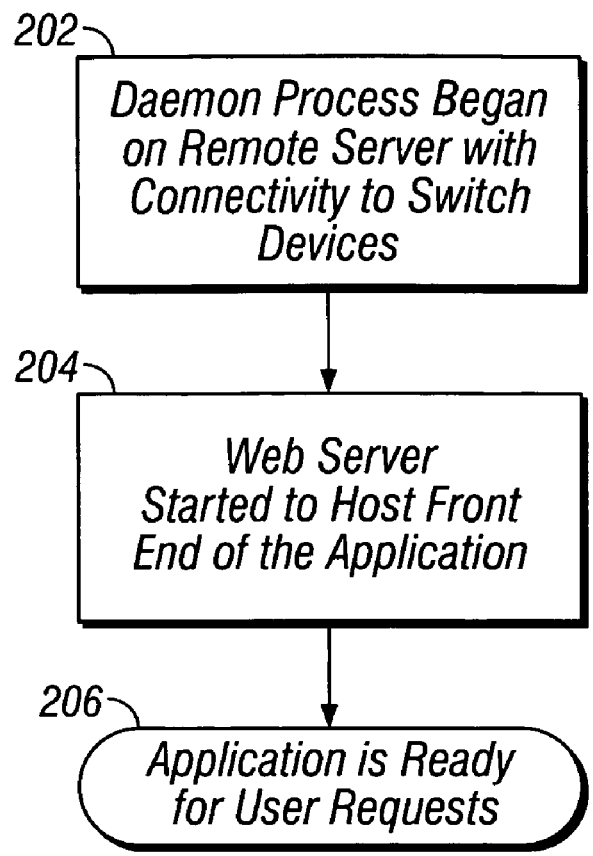
FIG. 2 is a flow diagram showing the set-up steps of the present invention.
Figure 7:
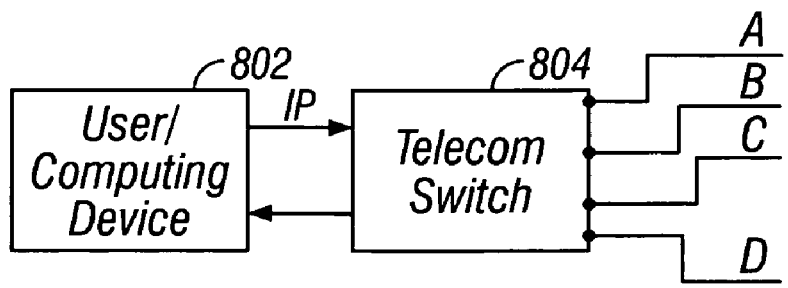
FIG. 7 is a process diagram showing a prior art system.

FIG. 2 is a flow diagram showing the steps which are necessary to complete before the testing process begins. This set-up process 200 involves two primary steps. First, in step 202, a daemon process is begun on remote server 107. This daemon process is set up to have connectivity to equipment 106. It interfaces with the device through a TCP/IP telnet connection. Through this interface, the daemon process, running on remote server 107, will communicate with switch 106 to support the back end 104 of the process 100. The switch 106, at the direction of the daemon process, will run a variety of tests on circuits A–D.

A second set up step 204 involves starting web server 112, including servlet 114. Web server 112 must be started up to host the front end 102 of the application. It is important to note that steps 202 and 204 could easily be reversed in this process.

The set up process 200 is completed in a step 206. At this point, the application is ready for user requests. Thus, the daemon process on remote server 107 simply lays in wait for requests from the servlet on web server 112. These requests from the servlet will instruct the daemon process running on remote server 107 with respect to the tests which are to be run by switch 106.

Figure 3A:
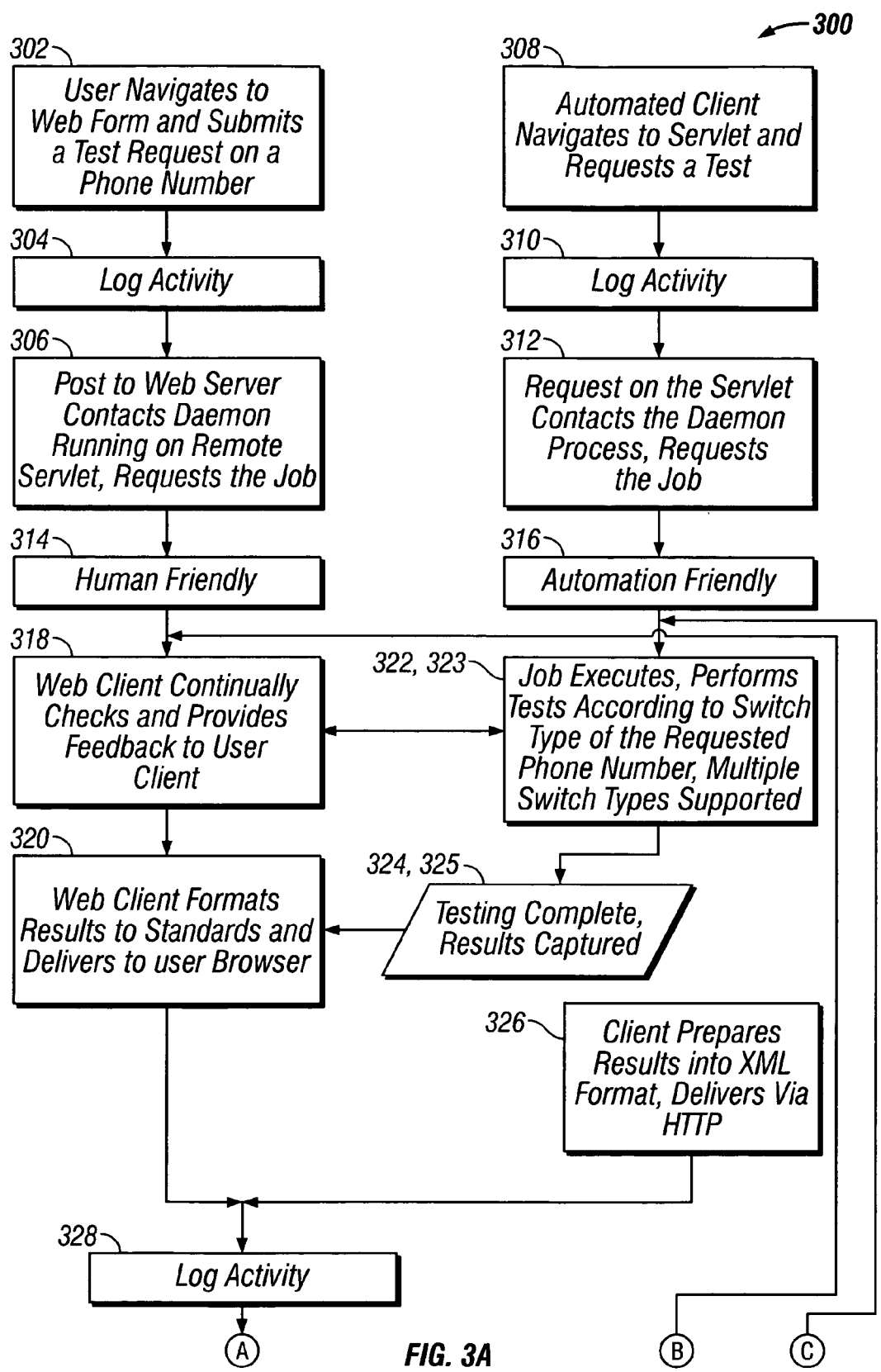
FIGS. 3A and 3B comprise a flow diagram showing the circuit testing procedures for both the human and automated sides of the present invention.
Figure 3B:
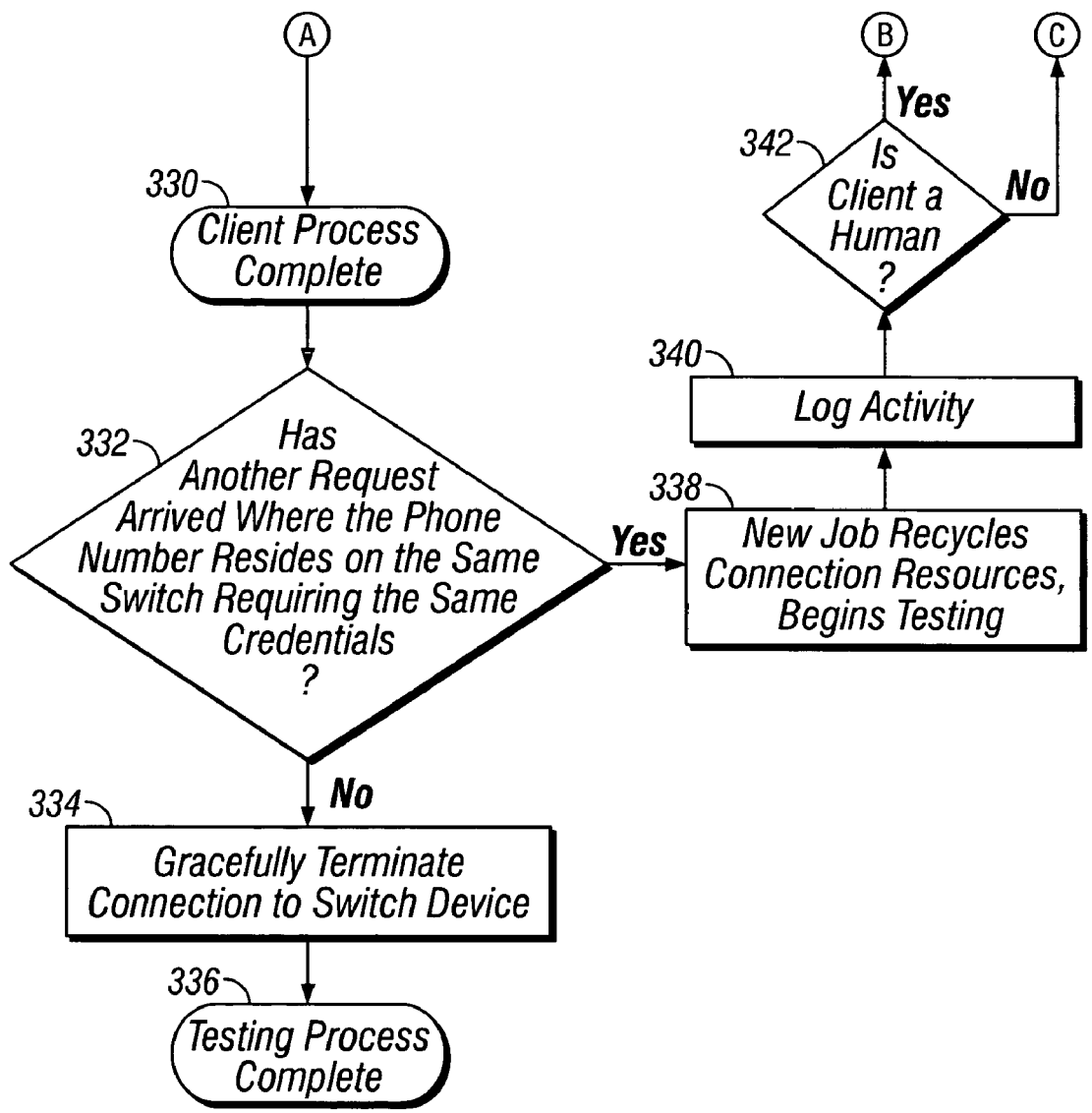

FIGS. 3A and 3B show an overview of the step by step process of where a human or an automated client requests a circuit be tested. The process has two sides. The first side is human friendly side 314. It includes the steps in the left-hand side column. The second side is an automation friendly side 316. This side 316 includes the steps on the right hand side of the flow chart. There are also many shared steps which are common to both sides. As can be seen from the figures, the two sides of the process come together and then divide at different points.

Figure 4:
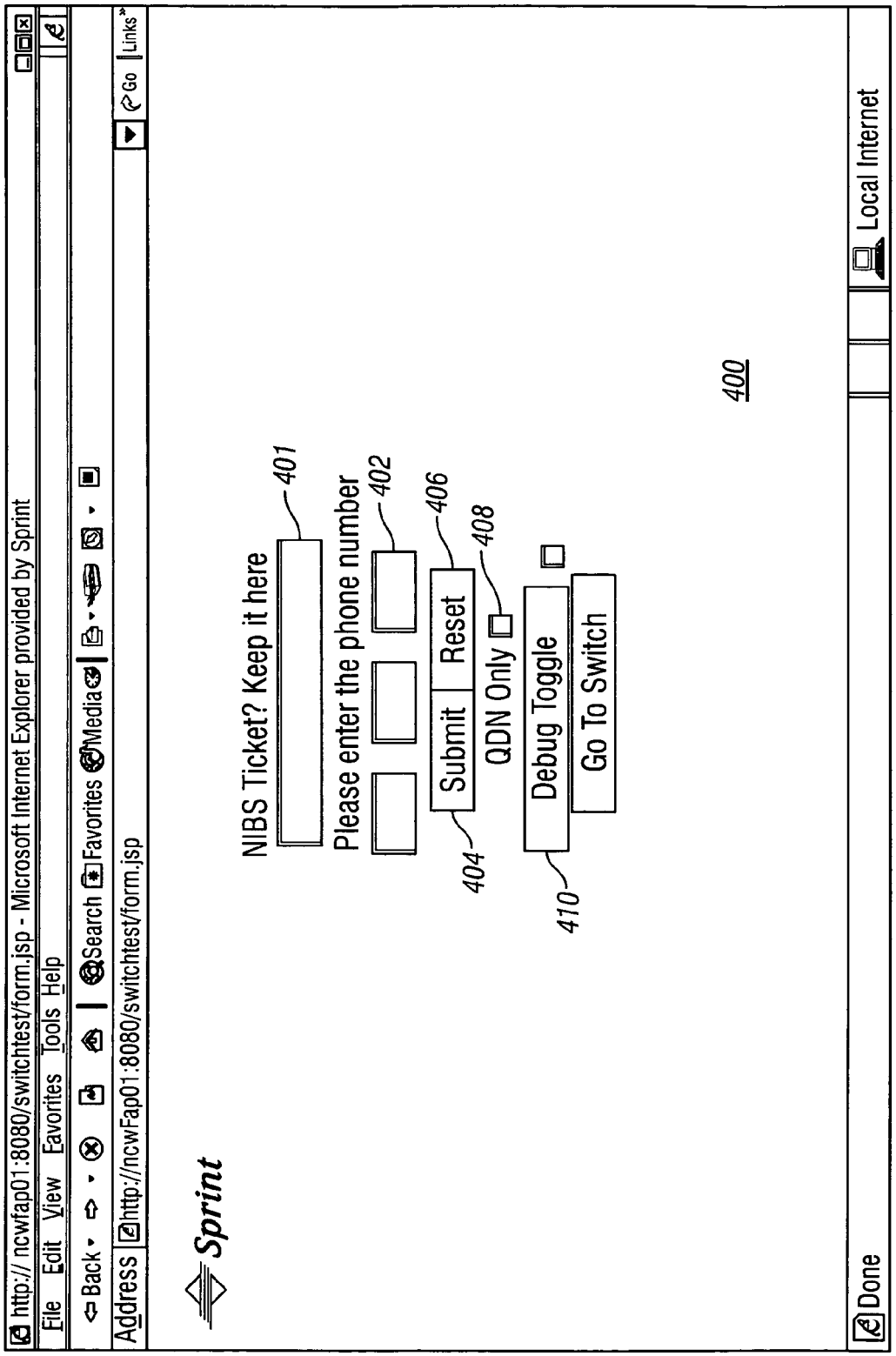
FIG. 4 shows a screen shot of the web form used on the human friendly side of the present invention.

Referring first to FIG. 3A, step 302 is the first step on the human side of the process. It comprises the act of the human client bringing up a specially designed web form in a web browser. One embodiment of such a web form is shown in FIG. 4. Webform 400 includes means to receive a number which is associated with a particular circuit of the plurality 109—A, B, C, or D. In the disclosed embodiment, this means to receive the number comprises a three field receiving area 402. Once a human client navigates to the web form, enters a number, and submits a test request for a particular phone number by clicking on the "submit" command icon 404, the human side of the process will have been successfully started.

Webform 400 also includes other useful features. First, it includes a reset toggle 406. Reset toggle 406 is used in the event the human client makes an error in entering the number for the circuit to be tested. Upon hitting the reset, the characters entered in the fields in entry boxes 402 will be cleared, and may then be reentered.

Another feature is the QDN only option 408 which is located below the submit and reset buttons (404 and 406). QDN option box 408, if checked, will cause the application to essentially short circuit itself. This means that when the process goes into switch 106, it will pull the information relative to the requested phone number and will then leave without progressing into the normal testing base.

Also included on the FIG. 2 web page, is a debugged toggle 410. This debugging toggle 410 allows the human client to view messages which are returned from the remote server 107. These messages are normally left in the background, but the client may view them if desired by debug toggle 410. This would normally be done only if there is a problem in executing the tests.

Though the web page of FIG. 2 discloses the entry of only one phone number, it is within the scope of the present invention for the process to alternatively include the ability to enter and process multiple numbers from the web page. This type of alteration would be well within the knowledge of one skilled in the art and is intended to be included within the scope of the present invention. It would also be within the skill of one in the art to adapt the later mentioned software arrangement to accommodate testing multiple numbers at one time. To do so would simply require some changes to servlet 114. Also possibly using an applet instead of a classic web browser. The servlet of the disclosed embodiment, however, is managed using Java. And programmed in a manner which would fall within that known to those skilled in the art.

Once the user has completed the test request using the webform as described in step 302, these activities regarding the number requested for testing are logged to a database in step 304. This is accomplished by making a database query. The information is entered into a row of data in a log tape. The information documented along with this comprises (i) the IP address from which the test was requested, (ii) possibly a group number associated with the IP address, (iii) the number for which the test is requested, (iv) whether or not the test request was granted, (v) the particular kind of device on which the test is to be run (e.g., a DMS 100 switch), and (vi) any job ID which was assigned to the request. The information logged can be accessed by a systems administrator or other party and used to develop reports, observe trends, troubleshoot, or other reasons.

Next, in step 306, a post will be made to the web server 112. This post will cause web server 112 to contact the Daemon process running on remote server 107. Further, the post will request the job that is to be performed with respect to the particular phone number which represents the particular circuit which is to be tested. The Daemon process retrieves the information handed to it by the web server and then attempts to log in to the switch 106. If the log in to switch 106 is unsuccessful, information will be returned to the web client stating that the log in has failed and explaining the reason. Depending on the reason, a systems administrator may need to be contacted.

If the log in is successful, the job will execute on the remote server as indicated in step 322. When the job executes, it performs a test of a circuit on the switch according to the particular switch type of the requested phone number. The particular switch type is identified by the Daemon process by recognizing the particular NPA/NXX combination of the input DN (dialed number).

Although a Nortel DMS 100 central office switch has been disclosed as being used for the B1 metalic line testing example shown here, the present invention is not intended to be limited to any particular switch. Multiple switch types are supported by the process. For example, all varieties of Nortel DMS central office switches could be used. Further, Lucent 5ESS and C2P switches could be used as well. The process could also be made interoperable with LNP databases.

Regardless of the switch involved, on the human side 314 of the process, the user is kept informed. While the job is executing, in step 318 the web client continually checks and provides feedback to the web client over the web in step 318. This is done so that the web client is given repeated updates during the process to enable the human client to know how the testing process is progressing.

One embodiment showing what will be observed by the human client over the web is shown in FIG. 6. FIG. 6 is a screen shot evidencing the series of status reports that are made to the human client. It may be seen in the first line that the first queue will be "test requested on 9195621111." The next line would appear subsequent to line 1 and would serve to inform the web client that the "jobs queued." Line 3 informs the user that the connection to the equipment has been successful. Subsequent to that, lines 4 and 5 inform the web client that the login to the device has been successful, and lines 6–7 indicate that the particular line has been accepted for testing. Lines 8 and 9 will tell the web client that the diagnostics and line tests are currently being performed on the device. Line 10 will inform the web client that the test is then complete. The following two lines indicate that the analysis and noise tests are being performed. Each line appears one after the other in sequence immediately after the event referred to has occurred. This gives the human client the confidence granted by knowing current status at all times during the process.

Once the job executes on the device and all of the testing is complete, the results of the tests are captured (see step 324). These captured results are then used to format the results which will appear on the webpage for the human client. This is done in step 320, wherein the captured results are placed in standard web formats, and then delivered to the user. They are delivered to the human client over the web browser as an appendage to the previous session that has showed the status during the testing procedure. The results will appear on the webpage immediately below the status information. An example of these formatted results may be seen by referring again to FIG. 6. The results my be seen immediately beneath the heading "Checking Results." As can be seen from this data, the results are listed beneath the telephone number that was tested. These results show that the tip ("TIP"), ring ("RNG"), and tip to ring ("TIP TO RNG") for the line registered as operable in the test. The test, however, shows that the resistance levels for the line tested out as irregular. Additionally, the test showed irregularity in the capacitance levels for the line. The results also include the information that the line is idle, that the line tested out at a particular noise level (which may or may not be within acceptable levels), and that the card diagnostics checked out okay. The irregularities in the capacitance and resistance levels may be indicative that the line has deteriorated to the extent that a fix agency must be contacted. The identification of the particular fix agency responsible is easily determined based on the number (circuit) and the nature of the problem. Thus, the present invention my be used to successfully test circuits for line card diagnostics, line noise tests, line resistance, and line capacitance.

Moving now to the opposite side of the circuit-testing process 300 shown in FIG. 3, we see that it includes an automation-friendly side 316. On automation-friendly side 316, in step 308, an automated client navigates to the servlet 114 and requests a test. In this case, there is no webform or other human-based interface mechanism. Rather, the computer communicates the number for the circuit to be tested directly with servlet 114. Automated clients, or in other words, automated computing devices or other systems used for automated circuit-monitoring responsibilities, are very common. One example of such a client would be automated ticketing system.

With these systems, the tests are requested by computers rather than manually by technicians. Once results are received, they will be transmitted to an appropriate systems administrator, or perhaps directly to a fix agency. The process of the present invention accomplished this by using the servlet 114 on the web server 112 to make the test request. The remote server 107 then communicates with the switch 106 to run the tests. Results are then received from the remote server 107 and placed in an orderly tab-access format on the automated client's browser as discussed above.

In step 310, the request by the automated client (in step 308) is documented by logging it just like with step 304 with the human side of the process.

Next, after the particular number for the circuit to be tested is received by the servet 114, as shown in step 312, the servlet 114 is made to contact the Daemon process running on remote server 107. Thus, the job is requested, and is ready to be executed. Thereafter, in step 323, the job executes and performs the tests. Just like with the human-side of the system, the automation friendly side performs the tests according to the switch type of the requested phone number. Also just like the human side, the automated side supports multiple switch types. Unlike with the human side of the process, however, the automated side has no need to continually provide feedback to the automated client. This is because the automated client is only interested in the results, and does not have the need for continual status reports. Therefore, one-time feedback is all that is provided.

In step 325, the testing is complete, and the results are captured. Instead of displaying the results on a web page like with a human client, the automated client receives the results in XML format in step 326. XML is a standard way of tagging data known to those skilled in the art. The data is tagged so that it can be recognized by web browsers. These automated results in XML format are delivered to the automated client via HTTP (which is the standard way of transferring information over the web).

An example of an XML file which includes the results of the tests as described in step 326 is provided in FIG. 5. In the output shown in FIG. 5, each line represents a particular result for the circuit test. All of the result information is included between what are called "tags." Tags are positioned as essentially book ends, which are recognizable in XML. For example, in line 4, you see two bookends identified as "switchtype." These bookends are the tags referred to above. In between these tags is the output for the switch type "DMS100." The "switchtype" bookends have been predefined in XML (in a manner which will be known to those skilled in the art) that it will be recognized that the output inserted therein is the type of switch on which the circuit exists which is being tested. Here we know the circuit is on a Nortel DMS 100 switch. (One skilled in the art will recognize the identifiers DMS 100 being indicative of a standard Nortel central office switch). The tags will enable the automated client to recognize the data that is being received and use it in the manner intended. The data could be used to create tables, create reports which will be transmitted to a systems administrator, or for other types of expressions which are handled on an automated level in an automated fashion.

Also revealed in the lines of the output XML file in FIG. 5 is an identification of the type of line being tested. Here a "ground start" type of line, is identified between an additional set of "linetype" tags. The particular kind of circuit being tested—here a ground start line—will be included within these tags.

From the rest of the lines, the results may be seen for three different types of tests. The first, identified between "testtype" tags is identified as "line," meaning that a standard line test was performed. Typically this would include testing resistance, capacitance, and possibly other physical characteristics which are used to measure the functionality of the line. The test results are included between two "result" tags. There it is indicated that the particular circuit being tested was not unreasonably degraded or disfunctional, as suggested by the word "pass" which is included between the tags. Between the plurality of "item" tags below this, are more specifics regarding the types of line tests performed. A likeness will be seen between these details and the ones disclosed for the line test in FIG. 6.

The next "testtype" shown in a block of lines below. This second test type is identified as "Card." This is intended to mean a standard card diagnostics test was run on the particular number. From the field between the "result" tags below, it is seen that the card diagnostics were okay, as indicated by the word "pass."

A third "noise" test results are included below the card diagnostic tests. Much in the same format, these results also indicate a "pass" between the "result" tags. An indication that the noise levels on the line were below an accepted maximum.

One skilled in the art will be able to recognize that this type of XML file will be usable in an automated sense to enable the automated client to be accessed directly or indirectly by a systems administrator to take appropriate action (or not).

Now, returning to, and moving further down the FIG. 3A portion of the flow chart, we see that the human friendly and automation friendly (314 and 316, respectively) sides of the process meet as one at step number 328. At this junction, test result information is logged. Included in this information is: (i) the line tested (logged by number); (ii) the switch involved; (iii) the identity of the client, whether human or automated, requesting the test, recorded by IP address; and (iv) what the test results were. The information log would also include whether or not the tests resulted in a "pass" condition or a "failure" condition on the line.

Next, we see that after the activity is logged in step 328 (shown in FIG. 3A), the client process is complete at step 330 (shown in FIG. 3B). The steps appearing after step 330 exist to avoid having the client reconnect for each test. This is done because many times the testing will involve a multiplicity of numbers, and it saves time to recycle the process for each number on the same switch. The client is not involved in these processes other than supplying the numbers initially.

In step 332, it is determined whether another request has arrived where the phone number resides on the same switch and requires the same credentials as completed request. If so, the connection to the switch device will be maintained and the job execution processes repeated. This process allows this to be done without terminating the connection to the switch. Where there is a new request, step 338 indicates that the connection is essentially recycled and the testing process begins again for the new number. Practically speaking, this is handled by the remote server by simply taking the connection information to the central office switch, and passing it to the next job in line. This avoids the expiration of automated or human credentialing time.

Next in step 340, information regarding the job recycle is logged much like in steps 328, 304, and 310.

In step 342, the human friendly 314 and automation friendly 316 sides of the process, once brought together at step 328 are again divided. This division in the process puts the right client on the right side—either human or automated—so that the new circuit testing information is interfaced properly. If the client is human, the new number will be processed first at steps 322 and 318 in which the job is executed with respect to the new number and results are continually reported over the web page to the web client. If, at step 342, the client is identified as automated, the new number will be processed on the automated side through steps 323, 325 and 326. The recycling process accomplished through steps 338, 340 and 342, by enabling the connection to the switch to be maintained for a group of numbers for which requests have been received, greatly saves time. Especially in the typical testing scenario in which numerous tests are run.

Returning now to the junction step 332, we will address the situation in which no further requests have arrived. This would be the "no" prong, which represents the situation where no phone number resides on the same switch requiring the same credentials. In such a case, the connection to switch 106, in step 334, will be gracefully terminated. This completes the entire testing process 336.

As the result of the FIG. 3 processes, it will be easy for clients to easily test any of a plurality of circuits 109, A–D for functionality. For human clients, this will be done through website interfacing. Automated clients will be handled over the web and have results returned in XML. The front end 102/backend 104 arrangement disclosed will save either client time and resources not possible with the prior art methods which involve simple interfacing with the switch.

As can be seen, the present invention and its equivalents are well-adapted to provide a new and useful web-based circuit testing system and method. Many different arrangements of the various components depicted, as well as components not shown, are possible without departing from the spirit and scope of the present invention.

The present invention has been described in relation to particular embodiments, which are intended in all respects to be illustrative rather than restrictive. Alternative embodiments will become apparent to those skilled in the art that do not depart from its scope. Many alternative embodiments exist but are not included because of the nature of this invention. A skilled programmer may develop alternative means of implementing the aforementioned improvements without departing from the scope of the present invention.

It will be understood that certain features and subcombinations are of utility and may be employed without reference to other features and subcombinations and are contemplated within the scope of the claims.

While the methods disclosed have been described and shown with reference to particular steps performed in a particular order, it will be understood that these steps may be combined, sub-divided, or reordered to form an equivalent method without departing from the teachings of the present invention. Accordingly, unless specifically indicated otherwise, the order and grouping of steps is not intended to be limiting. And not all steps listed in the various figures need be carried out in the specific order described.

The invention claimed is:

1. One or more computer-readable media, having computer-usable instructions embodied thereon for performing a method of testing a communications pathway associated with a computing device, said pathway being accessible by utilizing a unique identifier, the method comprising:
receiving said unique identifier from a client;
communicating a testing request to said computing device using said unique identifier;
automatically facilitating one or more tests consistent with said testing request;
providing test status feedback to said client by way of facilitating one or more tests;
retrieving information from said computing device regarding the functionality of said pathway; and
making said information available to said client.

2. The media of claim 1, wherein said client is a human, and said method comprises:
providing a webpage; and
receiving said unique identifier from said human client using said webpage.

3. The media of claim 2, said method comprising:
making said information regarding the functionality of said pathway available to said client using said webpage.

4. The media of claim 2, wherein said step of providing test status feedback to said client comprises providing said test status feedback to said human client using said webpage.

5. The media of claim 1, wherein said client is automated, and said method comprises:
interfacing with said automated client to accomplish said receiving, providing and making steps.

6. The media of claim 5, said providing step and said making step comprising:
placing said test status and said information in XML format; and
delivering said test status and said information to said automated client using HTTP.

7. The media of claim 1, said method comprising:
determining whether another testing request has arrived for said unique identifier on said device; and repeating said method if another testing request has arrived.

8. The media of claim 7, said method comprising:
terminating said method if no other testing request has arrived for said unique identifier on said device.

9. The media of claim 1, said method comprising:
running a process on a server to accomplish at least one of said receiving, communicating, facilitating, providing, retrieving, and making steps.

10. The media of claim 1, said method comprising:
running a process on a web server to accomplish at least one of said receiving, communicating, facilitating, providing, retrieving, and making steps.

11. The media of claim 1, said method comprising:
running a process on a servlet on a web server to accomplish at least one of said receiving, communicating, retrieving, and making steps.

12. The media of claim 1, said method comprising:
running a process on a remote server; and
communicating with said device using said process running on said remote server to accomplish at least one of said communicating, facilitating, and retrieving steps.

13. The media of claim 1, said method comprising:
running a daemon process on a remote server; and
communicating with said device using said daemon process running on said remote server to accomplish at least one of said communicating, facilitating, and retrieving steps.

14. The media of claim 1, wherein said unique identifier includes a telephone number.

15. A computer-implemented method for testing a communications pathway on a telecommunications device, the method comprising:
receiving a unique identifier from a client device;
utilizing said unique identifier to access said pathway by communicating a testing request to conduct one or more tests to said telecommunications device;
automatically conducting said one or more tests based on said request;
providing test status feedback of said one or more tests to said client;
retrieving information from said telecommunications device regarding the results of said one or more tests; and
making said information available to said client.

16. The method of claim 15 wherein said client is a human, said method comprising:
providing a webpage; and
receiving said unique identifier from said human client using said webpage.

17. The method of claim 16 comprising:
making said information regarding results of said one or more tests available to said client using said webpage.

18. The method of claim 16 wherein providing test status feedback to said client comprises providing said test status feedback to said human client using said webpage.

19. The method of claim 15, wherein said client is automated, said method comprising:
interfacing with said automated client to accomplish said receiving, providing, and making steps.

20. The method of claim 19, said providing step and said making step comprising:
placing said information in XML format; and
delivering said information to said automated client using HTTP.

21. The method of claim 15 comprising:
determining whether another testing request has arrived for said unique identifier on said device; and
repeating said method if another testing request has arrived.

22. The method of claim 21 comprising:
terminating said method if no other testing request has arrived for said unique identifier on said device.

23. The method of claim 15 comprising:
running a process on a server to accomplish at least one of said receiving, utilizing, conducting, providing, retrieving, and making steps.

24. The method of claim 15 comprising:
running a process on a web server to accomplish at least one of said receiving, utilizing, conducting, providing, retrieving, and making steps.

25. The method of claim 15 comprising:
running a process as a servlet on a web server to accomplish at least one of said receiving, utilizing, conducting, providing, retrieving, and making steps.

26. The method of claim 15 comprising:
running a process on a remote server; and
communicating with said device using said process running on said remote server to accomplish at least one of said utilizing, conducting, and retrieving steps.

27. The method of claim 15 comprising:
running a daemon process on a remote server; and
communicating with said device using said daemon process running on said remote server to accomplish at least one of said utilizing, providing, and retrieving steps.

28. The method of claim 15 comprising:
including said method in one of machine-readable media, computer-useable instructions, data structures, program modules, RAM, ROM, EEPROM, memory, CD-ROM, digital versatile discs (DVDs), holographic media, optical disc storage, and magnetic storage devices.

29. A computer system for performing a method of testing a communications pathway (accessible by a unique identifier) associated with a telecommunications switch, comprising:
a server device coupled to a client device by one or more networks, wherein said server device is configured to receive said unique identifier from said client device;
wherein said server device is further configured to automatically communicate a testing request of one or more tests to said switch based on said identifier; and
wherein said server device is further configured to provide an interface that displays test-status feedback and information regarding the functionality of said pathway to said client.

30. The system of claim 29, wherein said switch is a telecommunications home office switch.

* * * * *